United States Patent
Nah et al.

(10) Patent No.: US 9,263,378 B1
(45) Date of Patent: Feb. 16, 2016

(54) BALL GRID ARRAY AND LAND GRID ARRAY ASSEMBLIES FABRICATED USING TEMPORARY RESIST

(71) Applicant: International Business Machines Corporation, Armonk, NY (US)

(72) Inventors: Jae-Woong Nah, Closter, NJ (US); Charles L. Reynolds, Red Hook, NY (US); Katsuyuki Sakuma, Fishkill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/451,411

(22) Filed: Aug. 4, 2014

(51) Int. Cl.
  *H01L 21/48* (2006.01)
  *H01L 23/498* (2006.01)
  *H01L 21/033* (2006.01)
  *H01L 23/00* (2006.01)

(52) U.S. Cl.
  CPC ...... *H01L 23/49816* (2013.01); *H01L 21/0334* (2013.01); *H01L 21/4828* (2013.01); *H01L 21/4842* (2013.01); *H01L 23/49805* (2013.01); *H01L 23/49838* (2013.01); *H01L 23/49861* (2013.01); *H01L 24/11* (2013.01); *H01L 24/14* (2013.01); *H01L 24/81* (2013.01); *H01L 2224/10165* (2013.01); *H01L 2224/11005* (2013.01); *H01L 2224/11466* (2013.01); *H01L 2224/11849* (2013.01)

(58) Field of Classification Search
  CPC . H01L 2224/11; H01L 23/5389; H01L 24/97; H01L 2224/24137; H01L 2224/13022; H01L 2224/13023; H01L 2225/1058; H01L 23/3114; H01L 24/12
  See application file for complete search history.

(56) References Cited

U.S. PATENT DOCUMENTS

| 7,078,629 B2 | 7/2006 | Umemoto |
| 7,173,193 B2 | 2/2007 | Brodsky |
| 7,726,544 B2 | 6/2010 | Fang |
| 7,931,187 B2 | 4/2011 | Gruber |
| 8,304,663 B2 | 11/2012 | Ohsumi |
| 8,492,262 B2 | 7/2013 | Gruber |
| 2001/0040290 A1 | 11/2001 | Sakurai |
| 2010/0248451 A1 | 9/2010 | Pirogovsky |
| 2013/0157439 A1 | 6/2013 | Blackshear |

FOREIGN PATENT DOCUMENTS

| JP | 4963998 | 6/2012 |
| JP | 5243735 | 7/2013 |
| KR | 20100053307 | 5/2010 |
| KR | 20130030054 | 3/2013 |

*Primary Examiner* — Roy Potter
(74) *Attorney, Agent, or Firm* — Louis J. Percello; Otterstedt, Ellenbogen & Kammer, LLP (57) ABSTRACT

Ball grid assembly (BGA) bumping solder is formed on the back side of a laminate panel within a patterned temporary resist. Processes such as singulation and flip chip module assembly are conducted following BGA bumping with the temporary resist in place. The resist is removed from the back side of the singulated laminate panel prior to card assembly. Stand-off elements having relatively high melting points can be incorporated on the BGA side of the laminate panel to ensure a minimum assembly solder collapse height. Alignment assemblies are formed on the socket-facing side of an LGA module using elements having relatively high melting points and injected solder.

16 Claims, 10 Drawing Sheets

BALL GRID ARRAY AND LAND GRID ARRAY ASSEMBLIES FABRICATED USING TEMPORARY RESIST

FIELD

The present disclosure generally relates to the electrical and electronic arts and, more particularly, to methods of forming ball grid array bumps on the back sides of substrates, structures obtained by such methods, and land grid array modules formed with alignment features.

BACKGROUND

Flip chip technology has been widely used as it allows a high I/O count, high density interconnection scheme with proven performance and reliability. Solder bumps are deposited on contact pads on both chip surfaces and substrate surfaces, and then the chips are flipped and positioned such that the solder bumps are aligned with matching pads of an external circuit. Solder reflow completes the interconnection process, after which underfill material is introduced to fill the spaces about the interconnections.

In ball grid array (BGA) technology, metal balls comprised of solder are employed for packaging integrated circuits on a printed circuit board. A chip is attached to one side of a substrate. Solder balls are secured to the opposite side of the substrate. The substrate contains traces that electrically connect the chip to the ball grid. The package comprising the chip, substrate, and ball grid array is positioned on a printed circuit board that has contact pads that match the ball grid array. Once properly positioned, the assembly is subjected to heat such that the solder melts. The assembly is then cooled so that the solder cools and solidifies, thereby connecting the package to the circuit board. An assembled board is known as a circuit card assembly (CCA).

Semiconductor chips can be assembled with cored or coreless substrates during packaging. A cored substrate typically contains a layer of material that provides mechanical strength to the substrate. An epoxy-glass reinforced layer is used in some substrates to help prevent bending or warping during bonding or dicing. Coreless substrates, which are also referred to as coreless laminates, lack such a core layer and are more subject to warping than cored laminates. Clamping fixtures have been employed to hold coreless substrates during assembly. Coreless substrates can offer lower cost, thinner package thickness for mobile applications, and some performance advantages over cored substrates.

FIG. 5 is a flow chart showing a conventional process flow employed in fabricating a circuit card assembly. A laminate panel is obtained followed by pre-solder bumping on the front side (the chip attachment side) of the laminate panel. Singulation of the laminate panel is performed by known techniques such as scribing/breaking, sawing, and/or laser radiation. Flip chip module assembly includes joining the chip to the singulated laminate and applying underfill. The assembly modules are mounted to a fixture and BGA bumping on the back side of each module is performed. Second level packaging as described above is employed to produce the circuit card assembly.

Figure 5A:
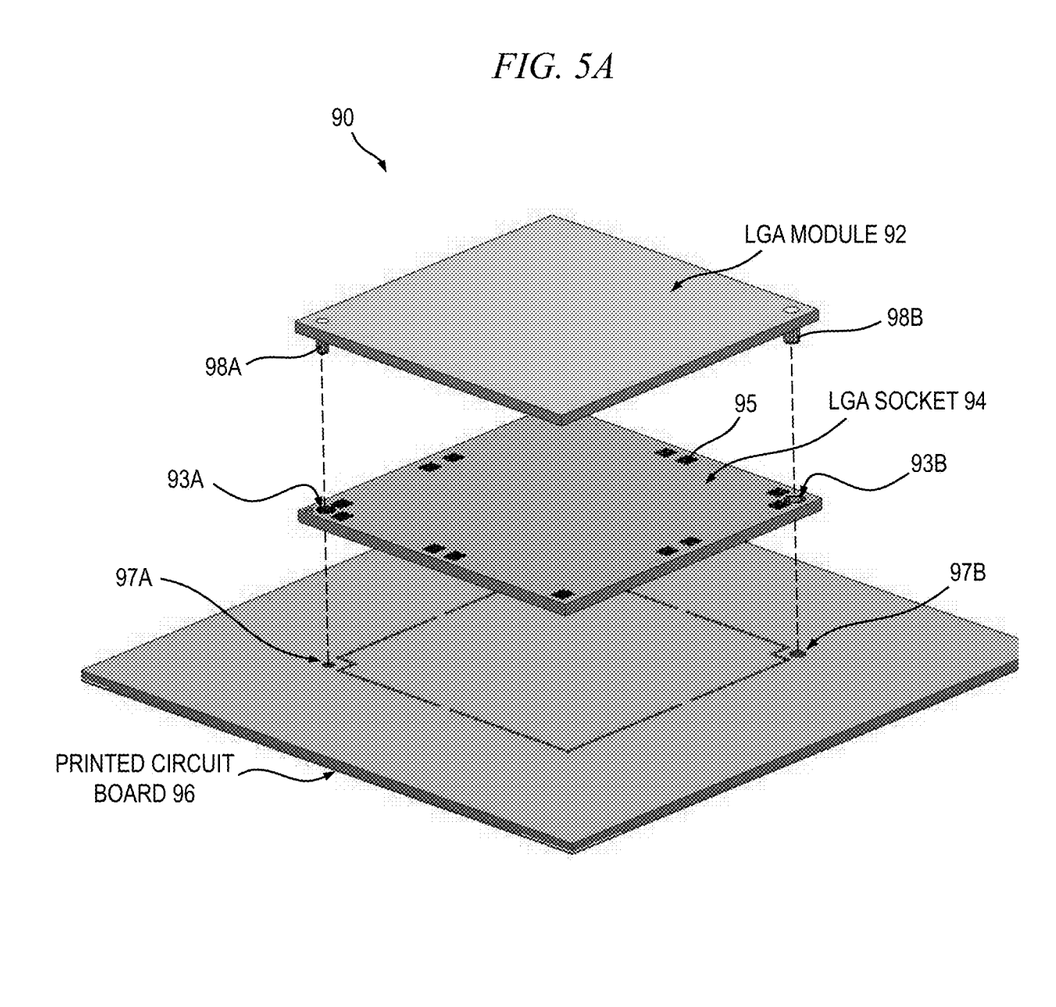
FIG. 5A is a schematic, exploded perspective view showing an assembly including an LGA module and an LGA socket.
Figure 5B:
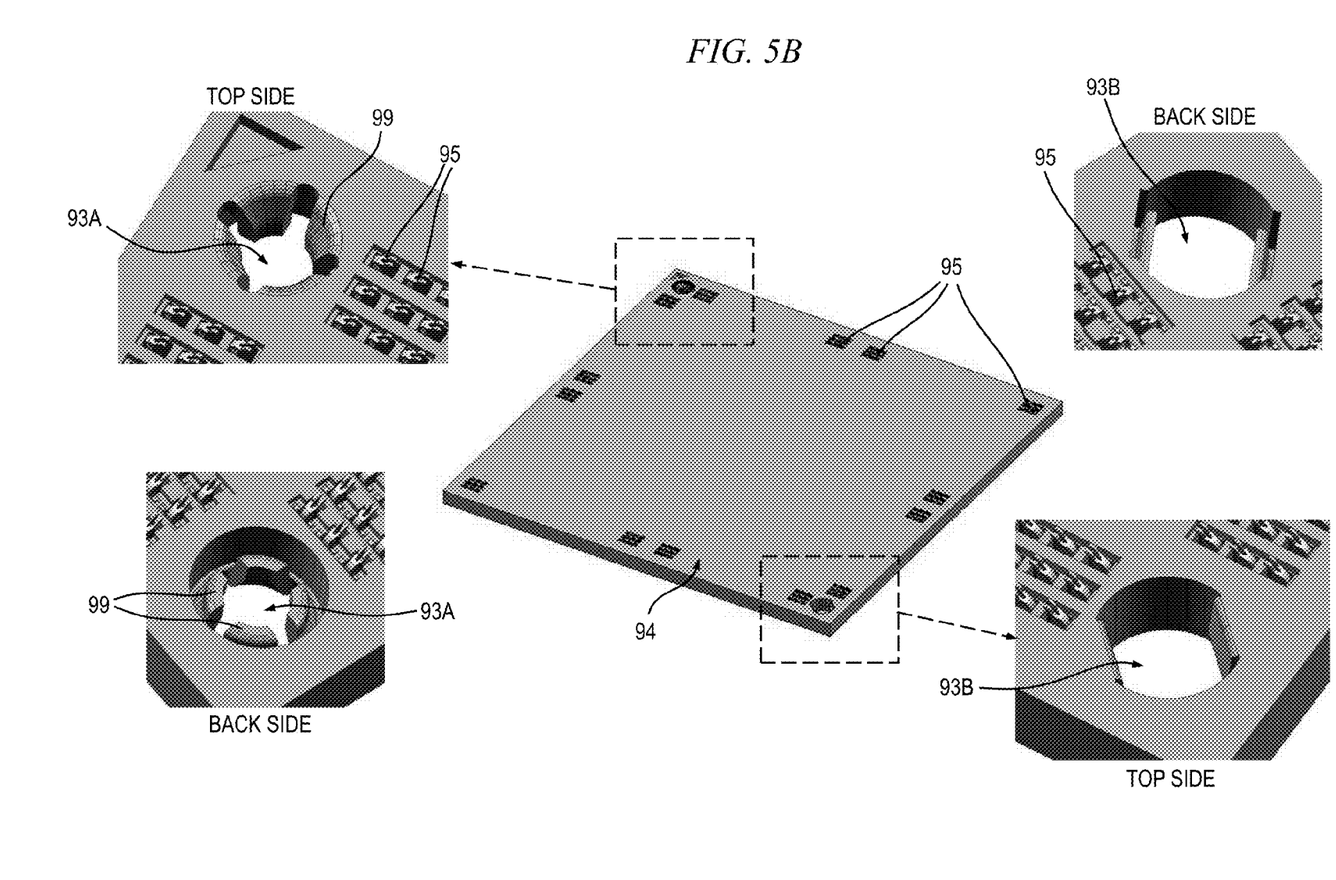
FIG. 5B is a schematic illustration of the socket of the assembly illustrated in FIG. 5A and enlarged portions of the socket.
Figure 6:
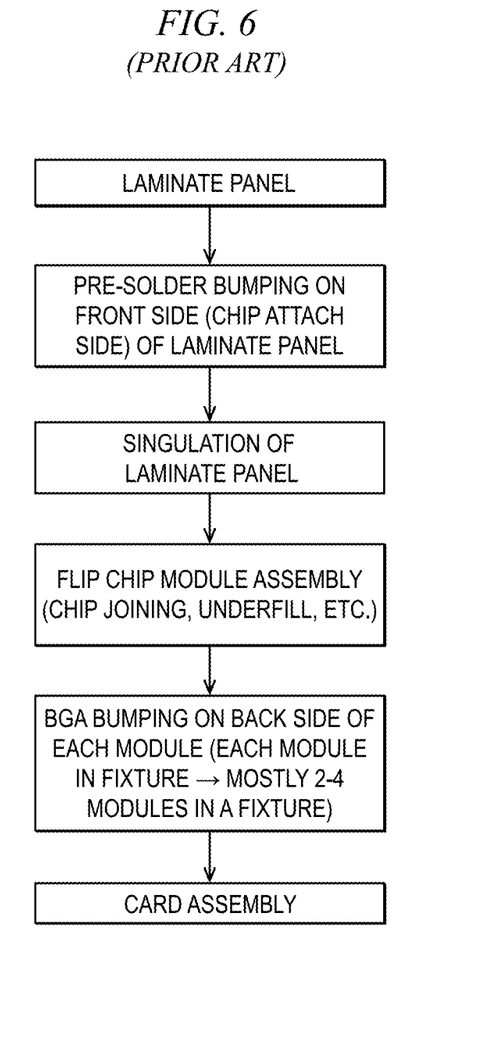
FIG. 6 is a flow chart illustrating steps of a prior art method for fabricating circuit card assemblies.
Figure 7:
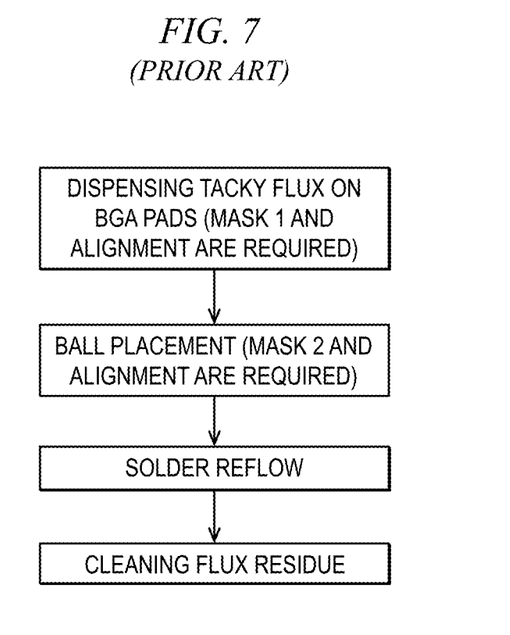
FIG. 7 is a flow chart illustrating steps of a prior art method for BGA bumping.

Ball grid array solder bumping is employed for second level packaging of module assemblies on a card to fabricate a circuit card assembly. Presently BGA bumping is performed by solder ball attachment following first level packaging. Five steps are generally required for BGA bumping: 1) assembling an array of single modules on a fixture; 2) dispensing tacky flux on the BGA pads using a first mask; 3) placing solder balls using a second mask; 4) solder reflow; 5) cleaning flux residues. FIG. 6 is a flow chart showing steps 2-5, which corresponds to the BGA bumping step shown in FIG. 5. Card assembly follows these steps. The steps are time consuming and impair process flow. The solder balls can move during the reflow process, causing unwanted bump bridging. Moreover, as the pitch of BGA pads becomes finer, the ball size decreases and placement of the solder balls becomes more difficult. Ball sizes of 300 μm and pitch less than 500 μm are exemplary. Placement of solder balls in assemblies using coreless laminates is also problematic due to warpage of such laminates, particularly with solder balls having diameters below 500 μm.

Land grid array (LGA) assemblies are also employed for second level packaging of chip modules to printed circuit boards. Such assemblies may include an interposer or socket having an array of embedded and electrically conductive contacts that are exposed on the front and back faces of the interposer or socket housing. The exposed contacts mirror those of the LGA module and the LGA contact pads on an opposing surface of the printed circuit board. Alignment of the electrical contacts is required when mounting the LGA module.

SUMMARY

Principles of the present disclosure provide techniques for BGA bumping on the back side of a panel using a temporary resist. In one aspect, an exemplary method includes obtaining a structure including: a panel including a front side, a back side, and a plurality of electrically conductive contact pads, a patterned resist layer directly contacting the back side of the panel, the patterned resist layer including a plurality of channels, and a plurality of solder bumps, each of the solder bumps being within one of the channels and electrically contacting one of the contact pads. The method further includes singulating the panel to obtain a plurality of panel portions, each panel portion having front and back sides, portions of the resist layer, and an array of the solder bumps. A chip is connected electrically and mechanically to the front side of the panel of the structure or to the front side of one of the panel portions obtained following singulation. Connection of the chip is effected while the resist layer is on the back side of the panel or while a portion of the resist layer is on the back side of one of the panel portions, the chip comprising one or more electronic devices. The method further includes stripping the patterned resist layer from the back side of the one of the panel portions subsequent to the step of connecting the chip electrically and mechanically to the front side of the panel of the structure or to the front side of the one of the panel portions. The one of the panel portions is connected electrically and mechanically to a circuit card. The step of connecting the one of the panel portions includes the step of reflowing the solder bumps.

An exemplary structure in accordance with the present disclosure includes a substrate including a front side, a back side, and electrically conductive contact pads on the back side. A patterned resist film directly contacts the back side of the substrate, the resist film including channels exposing a plurality of the contact pads. The structure further includes a plurality of solder bumps, each of the solder bumps being within one of the channels in the resist film and electrically contacting one of the contact pads. A plurality of contact elements are on the front side of the substrate and are configured for electrical connection to a chip.

A further exemplary method includes obtaining a land grid assembly module, forming a patterned resist layer on the land grid assembly module, the patterned resist layer including first and second channels, inserting an alignment element having a first melting point within each of the first and second channels in the resist layer, and injecting molten solder material having a second melting point lower than the first melting point into the first and second channels. The solder material in the first and second channels is cooled, thereby forming first and second alignment assemblies attached to the land grid assembly module, each of the first and second alignment assemblies comprising one of the alignment elements encased by solder material. The patterned resist layer is removed from the land grid assembly module.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Structures and fabrication methods as disclosed herein can provide substantial beneficial technical effects. For example, one or more embodiments may provide one or more of the following advantages:

Facilitates process flow;
Enables fine pitch BGA with small BGA bumps;
Protects BGA bumps during subsequent bonding and assembly processes such as singulation, chip joining, and underfill application;
Reduces laminate panel or singulated substrate warpage during flip chip module assembly;
Allows for a variety of BGA pitch/pattern, eliminating the need for special bond and assembly fixtures;
Allows for a variety of BGA bump diameters within the single assembly which may be beneficial for special compensation if required to prevent shorting when attaching substrate onto PCB;
Enables the formation of stand-off elements on the BGA side of a substrate;
Facilitates alignment of land grid array modules and laminates with other electronic components.

These and other features and advantages will become apparent from the following detailed description of illustrative embodiments thereof, which is to be read in connection with the accompanying drawings.

One or more embodiments of the disclosed methods or elements thereof can be implemented in the form of a computer program product including a tangible computer readable recordable storage medium with computer usable program code for performing the method steps indicated. Furthermore, one or more embodiments or elements thereof can be implemented in the form of a system (or apparatus) including a memory, and at least one processor that is coupled to the memory and operative to perform exemplary method steps. Yet further, in another aspect, one or more embodiments or elements thereof can be implemented in the form of means for carrying out one or more of the method steps described herein; the means can include (i) hardware module(s), (ii) software module(s), or (iii) a combination of hardware and software modules; any of (i)-(iii) implement the specific techniques set forth herein, and the software modules are stored in a tangible computer-readable recordable storage medium (or multiple such media).

DETAILED DESCRIPTION

Initially, the complete disclosure of commonly assigned U.S. Pat. No. 7,931,187 is expressly incorporated herein by reference in its entirety.

Figure 1:
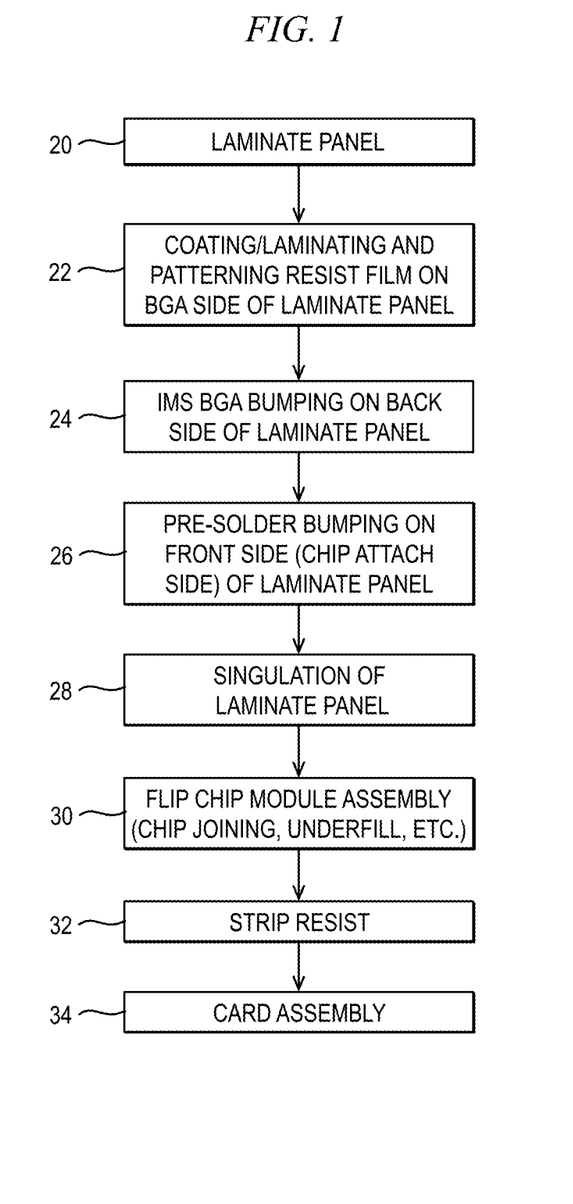
FIG. 1 is a flow chart illustrating an exemplary method for fabricating a circuit card assembly.

The flow chart provided in FIG. 1 shows an exemplary fabrication method starting with the step 20 of obtaining a laminate panel. Laminate panels made from organic materials are employed in one or more embodiments of the fabrication method. Glass panels are employed in other embodiments. Ceramic substrates can be employed in further embodiments. Ceramic substrates are not typically manufactured in panel size. A laminate panel may be cored or coreless. Glass-reinforced cores with higher modulus have less package deformation but are susceptible to higher stress and decreasing BGA reliability life. Higher coefficient of thermal expansion (CTE) cores match copper but can induce die material stress that causes device passivation separation or chip package interaction (CPI) failures. By increasing the glass fiber matrix, the core can be stronger but may develop higher CTE or modulus.

In the following step 22, a resist film is applied on the back side (BGA side) of the panel. The resist film is patterned to form an array of openings. The openings are of selected size(s) and pitch. The resist film layer may be applied as a coating or by laminating a dry film using heat and pressure. An acrylic photoresist film is employed in one or more embodiments. Solder resists that can withstand the higher temperatures associated with lead-free solders are being investigated by the industry and may be employable in the disclosed method. Photoresist deposition and dry film lamination are techniques known in the art for providing layers than can be patterned. The layer is patterned by subjecting the photoresist layer to light through a mask and removing developed or undeveloped photoresist, depending on the type of photoresist employed. If a laminated film is employed, the protective layer (not shown) above the photoresist layer is removed shortly before photoresist development. The photoresist above selected regions of the laminate panel, following developing and washing, is removed to expose electrically conductive contact pads (BGA pads) on the back side of the panel. A plurality of vertical channels is accordingly formed over the laminate panel. Because the photoresist layer has a substantially uniform thickness over the entire laminate panel, the channels therein have a substantially uniform height. The resist film in one or more embodiments is a polyimide film, a polytetrafluoroethylene film, or a polyphenylene ether film that does not react with the molten solder. Dry films that exhibit heat resistance exceeding 300° C. reflow temperatures are commercially available and, if used, can be applied using a pressurized hot roll. Dry photoresists which provide uniform photoresist thickness on a laminate panel are employed in some embodiments. Photoresist films having thicknesses ranging from 100-1000 µm may be employed in conjunction with one or more embodiments. Other high temperature resist films that are unreactive with molten solder are possible alternatives.

Solder is injected in the channels by a fill head that traverses the surface of the resist layer in the next step 24 shown in FIG. 1. In one or more embodiments, molten solder is injected using a fill head that traverses the top surface of the resist layer. The channels are preferably filled completely to the tops, thereby ensuring uniformity of height of the resulting solder bumps without leaving a solder residue on the mask. No solder flux is required nor is any employed in one or more exemplary embodiments. The absence of flux prevents volume shrinkage. The molten solder is directly injected into the channels in a low oxygen environment, preferably less than 10,000 ppm in a nitrogen environment. Alternatively, a forming gas environment including nitrogen and hydrogen may be employed (e.g. 90% $N_2$, 10% $H_2$). The fill head for injecting the molten solder may include compliant material for exerting a compressive force. The compliant material may include, for example, a bulk compressible layer with a thin, low-friction layer. Non-limiting examples of the compliant material include silicone rubber and silicone closed cell sponge. Non-limiting examples of the low friction layer include commercially available fluoropolymers. The total thickness of the low friction layer and bulk compressible layer may be, for example, from about 0.79-6.35 mm. The contact pressure exerted on the substrate by the fill head may be about ten to sixty pounds per square inch. In some embodiments, pressure is about fifteen PSI. The compliant material allows good contact with the resist layer and helps avoid solder leakage. The solder injected has a relatively high melting point in some embodiments, though preferably below 285° C. in embodiments where an organic laminate panel is employed. Exemplary solders having relatively high melting points, indicated in parentheses, include Sn-20Au (280° C.), Sn-5Sb (243° C.), pure Sn (232° C.), Sn-0.7Cu (227° C.), Sn-3.5Ag (221° C.) and Sn-3.8AG-1.0Cu (217° C.). The specified solders are considered exemplary and non-limiting. Solder bumps formed in accordance with the process have a diameter of about 25 microns to about 1000 microns in one or more embodiments. Some fine pitch applications include solder bump diameters between about 200 microns to about 500 microns. It will be appreciated that solder bumps formed from the injection of molten solder as described herein may not be spherical, so the exemplary diameters may be average diameters. In some embodiments of the exemplary method, solder paste printing is employed rather than injecting molten solder. Reflow is required to form solder balls from the paste. Volume shrinkage from forming the paste into a ball is likely, though acceptable in some embodiments. Flux residue is removed when the resist layer is stripped in step 32.

The solder injected on the back side of the laminate panel is cooled in embodiments of the method wherein molten solder is injected into the channels of the photoresist film. Pre-solder bumping on the front side of the laminate panel takes place subsequent to completion of BGA bumping in the exemplary method. It will be appreciated that pre-solder bumping can be performed prior to BGA bumping in some embodiments. The "front side" refers to the side of the panel to which a chip is ultimately attached. The chip in some embodiments comprises a silicon-based integrated circuit. Step 26 in FIG. 1 may involve conventional processes such as solder paste printing, solder ball drop, molten solder injection, solder jetting, or other such processes that facilitate later chip attachment to the laminate panel to form a module. Singulation of the laminate panel (step 28) follows in the exemplary process. Standard laminate substrate assemblies are singulated prior to flip chip assembly in most cases, however chip scale packages (CSP) are typically singulated after flip chip attachment. Singulation can be performed in a number of different ways, as discussed above, to obtain a plurality of assemblies, each including a portion of the original laminate panel, a BGA and a resist layer on one side of the panel portion, and the pre-solder bumping features on the other side of the panel portion. A chip is joined to the assembly following singulation in step 30 of the exemplary process shown in FIG. 1. If laminate substrate assemblies have pre-deposited solder on the BGA pads, then the flip chip fixture that is used in assembly should have an open area to avoid BGA damage. The solder materials used for flip chip module assembly may or may not be the same as those used to form the solder bumps of the ball grid assembly. If the same solder material is used for both, the BGA bumps will melt during flip chip module assembly. If the BGA bumps are comprised of solder material(s) having higher melting points than the solder material employed for flip chip module assembly, they do not necessarily melt. The resist layer is stripped from the module assembly in step 32 followed by card assembly in step 34 to form a circuit card assembly. In some embodiments, it is not necessary to strip the resist layer before card assembly.

Figure 2A:
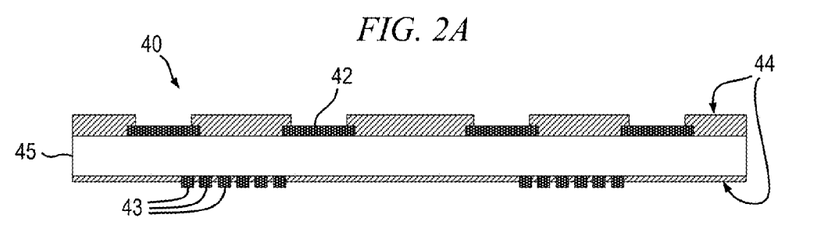
FIGS. 2A-H schematically illustrate steps of an exemplary method for fabricating a circuit card assembly.

Referring to FIGS. 2A-H, steps in performing a method in accordance with one aspect of the disclosure are schematically illustrated. As shown in FIG. 2A, a laminate panel 40 includes rows of wet-able contact pads 42, 43 and a solder mask 44 on a substrate 45. Non-limiting examples of laminate panels include substrate materials made of glass fibers in an epoxy and bismaleimide triazine (BT) resin. Ceramic substrates can be used in other exemplary embodiments. The wet-able pads may be copper, gold or nickel in some embodiments of the method. It will be appreciated that the contact pads 42 may or may not be of uniform height. Laminate panels as shown in FIG. 2A are commercially available and are employed by chip assembly businesses. In embodiments of the method wherein coreless laminates are employed, the use of a solder mask on one or both sides of the laminate panel is optional.

Figure 2B:
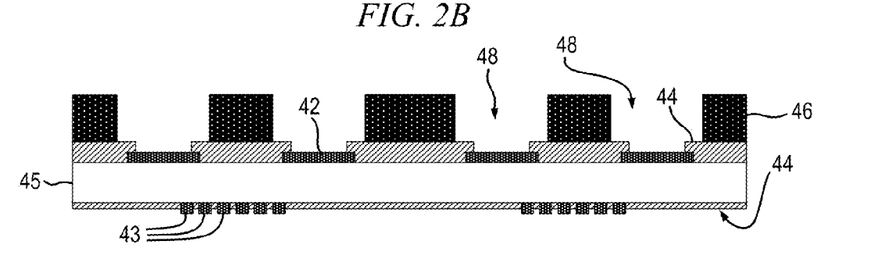

Referring to FIG. 2B, a resist layer 46 is applied to the laminate panel 40 and patterned to form the exemplary structure shown. The thickness of the resist layer to be used for BGA bumping in the exemplary fabrication method is 100-1,000 µm. As discussed above, a dry film resist layer is employed in some embodiments. The resist layer may be panel size or applied as a strip covering only a portion of the laminate panel. The resist layer is adhered to the BGA side of the substrate. The electrically conductive (e.g. copper) contact pads 42 are exposed following patterning of the resist layer by channels 48 formed therein.

Figure 2C:
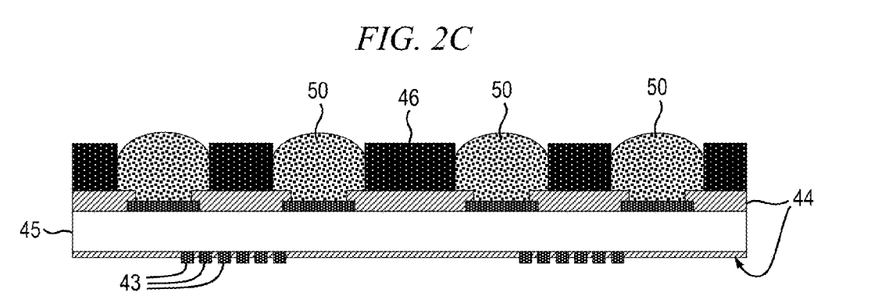

Solder is deposited in the channels 48 of the resist layer and directly contacts the BGA contact pads 42. Molten solder is deposited in the channels by a fill head (not shown) in one or more embodiments. As discussed above, the solder injected during the step illustrated in FIG. 2C has a relatively high melting point in some embodiments, though preferably below 285° C. where an organic substrate is employed. The solder wets on the BGA contact pads 42 and forms intermetallic compounds therewith. Alternatively, solder may be introduced into the channels 48 by solder paste printing as discussed above. In a further alternative, pre-formed solder balls (not shown) are placed into the channels 48 and then liquid flux is dispensed on the entire area. The flux residue can be removed when the resist layer 46 is stripped. In embodiments where molten solder is injected, the solder solidifies as shown in FIG. 2C in a low oxygen environment, forming bumps 50 generally conforming to the configurations of the channels 48 in the resist layer 46 and the exposed BGA contact pads 42 of the laminate panel. The solder that solidifies in the channels extends above the top surface of the resist layer in some embodiments, such as shown in FIG. 2C, though such extension is not required. Relatively small BGA bumps 50 (less than 300 μm in diameter) are formed in some embodiments with a pitch of less than five hundred microns using injection molded solder (IMS).

Figure 2D:
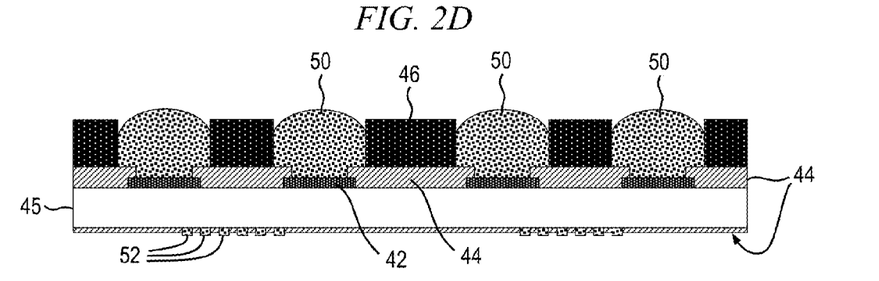

FIG. 2D schematically illustrates the step 26 of pre-solder bumping on the front, chip attach side of the laminate panel 40. This step involves conventional techniques such as solder paste printing, solder ball drop, the injecting of molten solder (IMS), or solder jetting. C4 (controlled collapse chip connection) balls are among the connecting structures that may be formed on the chip attach side of the panel 40. These techniques should be considered exemplary rather than limiting. The BGA (back) side of the laminate panel is unaffected by pre-solder bumping. Solder contacts 52 are formed on the chip attach side of the assembly. In some embodiments, pre-solder bumping is not required and accordingly solder bumps are not formed on the chip attach side. A chip may be attached using solder bumps formed on the chip itself in some embodiments. In some embodiments, pre-solder bumping is performed prior to applying the resist layer 46 (step 22 in FIG. 1).

Figure 2E:
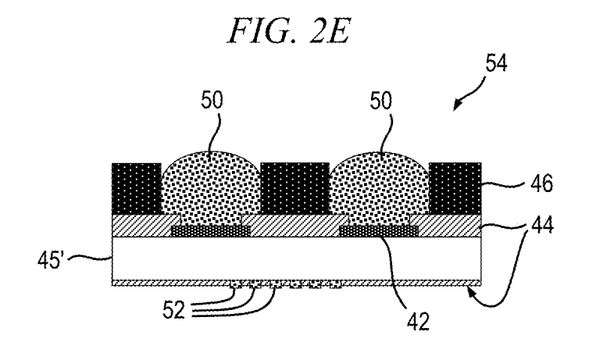
Figure 2F:
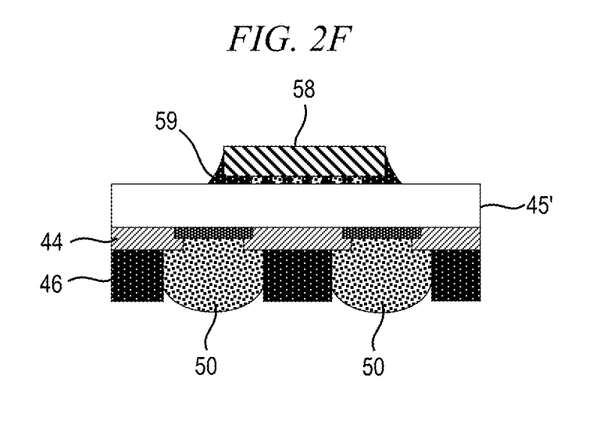

FIG. 2E schematically illustrates the singulation of the laminate panel and associated elements formed thereon into individual portions 54. The individual portions of the laminate panel 45 created by singulation can be referred to as substrates or laminates. The resist layer facilitates handling of the resulting structure(s) 54. Flip chip assembly, as shown in FIG. 2F, involves the attachment of a chip 58 using the solder contacts 52 formed on the laminate panel and corresponding wet-able contact pads (not shown) or solder bumps on the chip. The chip can be a semiconductor chip as known in the art or other type of chip that includes one or more electrical devices. The chip is electrically connected to the laminate panel following attachment. In one or more embodiments, bonding is performed in a temperature range between 210-300 degrees Celsius. Reflow is preferably conducted in a low oxygen environment. Flux can be used if it is required. The solder re-solidifies to form connections between the contact pads (e.g. copper pedestals) and the solder (e.g. C4 solder bumps) attached to the laminate panel, thereby electrically and mechanically connecting the chip 58 to the laminate 45'. Underfill material 59 is applied between each chip and laminate to fill the space around the array of C4 balls or other solder elements and the underlying laminate. The underfill material is subsequently cured. Underfill materials having low Young's modulus values are employed in one or more embodiments and provide protection for the electrical connections. In some embodiments, the resist layer 46 may reduce the warpage of the laminate panel as it is heated and cooled and improve the chip assembly yield. As discussed above, coreless laminates are particularly susceptible to warpage.

Figure 2G:
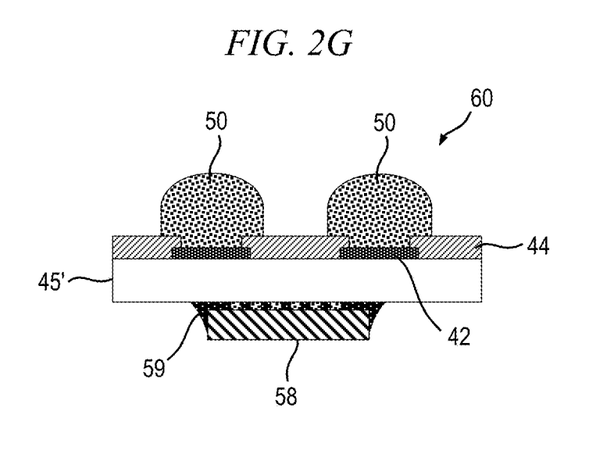
Figure 2H:
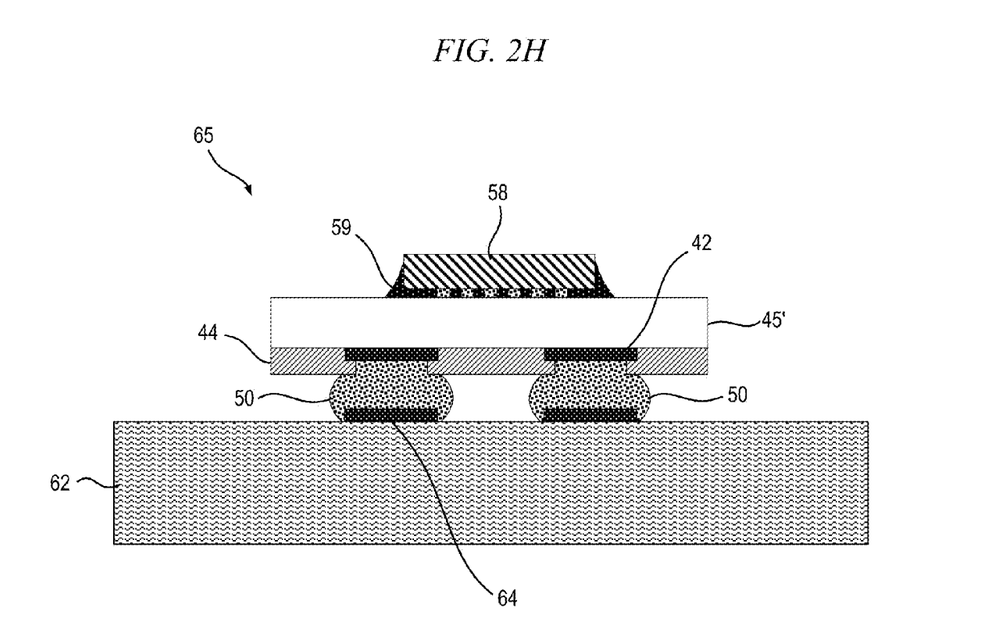

As shown in FIG. 2G, the resist layer 46 is stripped from the laminate 45' prior to card assembly. The stripping process may be performed through the use of a solvent, wet blasting, dry etching, wet etching, laser ablation, or other known procedures. The resulting structure 60 comprises a portion of the laminate, the attached chip on one side of the laminate, and an array of the solder bumps on the opposite (back) side of the structure. Once the structure 60 has been obtained, it is attached to a printed circuit board 62 to form a circuit card assembly 65 as schematically illustrated in FIG. 2H. The solder bumps 50 comprising the array are reflown and mechanically and electrically connect the structure 60 with contact pads 64 on the printed circuit board 62.

In some embodiments of the method, stand-off BGA elements are formed from a different solder composition than the solder composition employed for the solder bumps 50 forming the ball grid assembly. The solder composition used to form the stand-off elements melts at a higher temperature, thus creating a temperature hierarchy that permits the stand-off elements to function as spacers for guaranteeing the height of the structure 60 above the printed circuit board (PCB) 62. This arrangement accommodates those situations where underfill or other material used to protect the BGA or adhesion to the PCB is required. Referring, for example, to FIG. 2G, one of the two illustrated bumps 50 may be comprised of solder material having a lower melting point than the second of the two bumps. The second of the two bumps 50 would accordingly form a stand-off element that would not melt upon connection of the structure 60 to the printed circuit board 62. The card assembly step 34 would accordingly entail maintaining a temperature high enough to melt the plurality bumps 50 intended for the electrical connection of the structure 60 to the printed circuit board 62 but beneath the melting point of the plurality of elements used for the stand-off assembly.

Figure 3A:
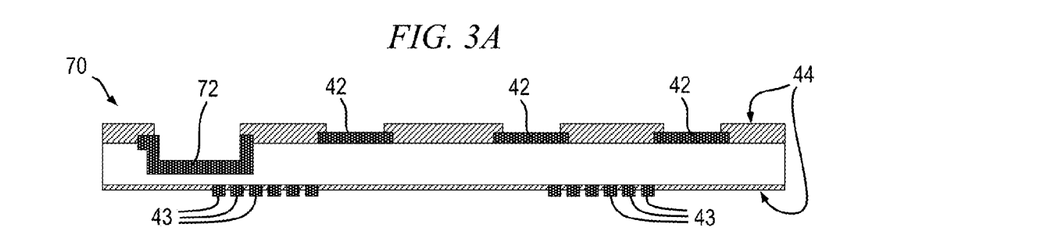
FIGS. 3A-3D schematically illustrate steps of an exemplary method for fabricating stand-off elements on the BGA side of a laminate panel.
Figure 3B:
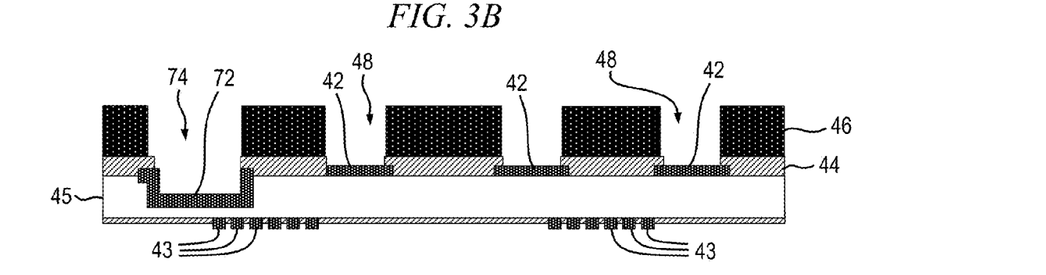
Figure 3C:
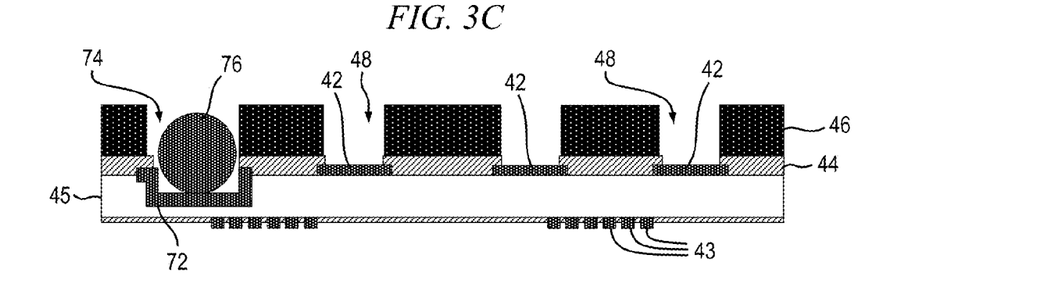
Figure 3D:
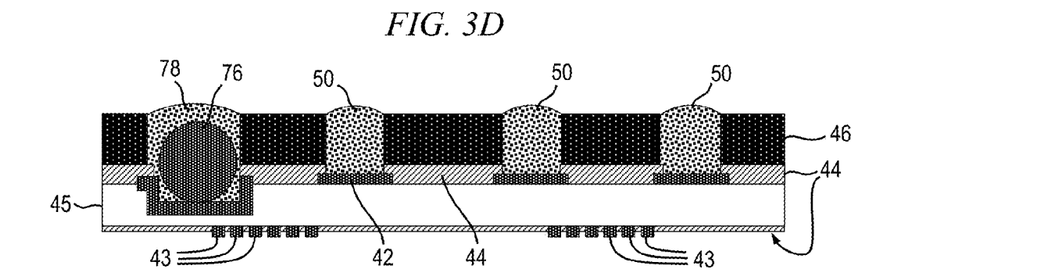

An alternative method of forming stand-off elements with a ball grid assembly is schematically illustrated in FIGS. 3A-3D. The same reference numbers employed with respect to FIGS. 2A-2G are used to designate similar elements in FIGS. 3A-3D. A panel such as a laminate panel 70 is obtained that is similar to the laminate panel 40 shown in FIG. 2A. The laminate panel 70, however, includes a plurality of contact pads 72 that are larger than the contact pads 42 employed elsewhere on the panel. As discussed above, the use of a solder mask 44 on one or both sides of the panel is optional if the laminate panel 70 is coreless. A resist layer 46 is applied to the BGA side of the laminate panel and patterned to form the exemplary structure schematically shown in FIG. 3B. Rows of channels 48 are formed in the patterned layer. In addition, a plurality of channels 74 having relatively large diameters are formed. The contact pads 42 are exposed by the channels 48 while the relatively large contact pads 72 are exposed by the larger channels 74. Stand-off elements 76 such as metal balls or metal-coated polymer balls are deposited within the relatively large channels 74. Copper and nickel are among the materials from which metal balls can be fabricated for the purposes of this exemplary embodiment. The stand-off elements 76 are positioned entirely within the channels 74, at or beneath the top surface of the resist layer 46. Solder material is deposited in all of the channels 48, 74. In one exemplary embodiment, molten solder material is injected into the channels from a fill head. In another exemplary embodiment, solder paste is deposited in the channels. The same solder material can be deposited in all channels 48, 74 using either technique. The deposited solder material fills the channels 48, 74 and partially or entirely encases the stand-off elements 76. The stand-off elements, which melt at a substantially higher temperature than the solder material, remain solid. The solder is cooled to form solder bumps 50 in the relatively small channels 48 and caps 78 on the stand-off elements 76, as shown in FIG. 3D. The top surface portions of the solder caps 78 and solder bumps 50 are substantially coplanar in some embodiments.

Figure 4:
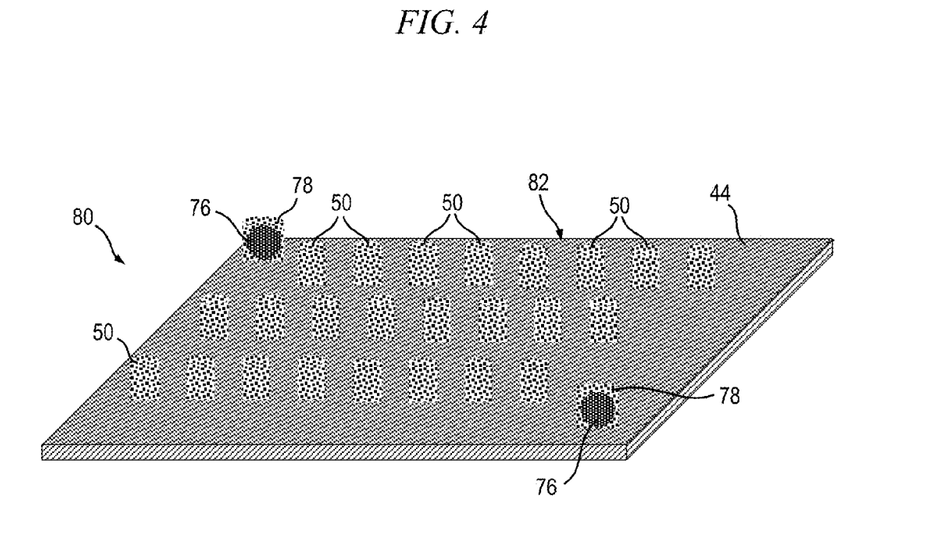
FIG. 4 is a schematic illustration of a singulated substrate including stand-off elements on the BGA side of the substrate.

The stand-off elements 76 are arranged such that, following singulation, at least two stand-off elements are included in the resulting structure of one or more embodiments. Referring to FIG. 4, an electronic assembly 80 is shown following singulation, chip attachment, and the stripping of the resist layer 46. FIG. 4 shows the BGA side of the resulting structure, which comprises a substrate 82, the solder mask 44 (if employed), the solder bumps 50, and the solder-encased stand-off elements 76. While two stand-off assemblies are shown in the exemplary structure 80, additional stand-off assemblies can be formed in alternative embodiments. The stand-off assemblies are advantageously located near the outer edges of the structure 80. In the exemplary embodiment, they are positioned near opposite corner portions of a rectangular substrate. The solder bumps 50 and capped solder elements forming the stand-off assemblies are the same in height in the exemplary embodiment. In some embodiments, the stand-off elements are employed to ensure a minimum assembly solder collapse height when the structure is mounted to a printed circuit board. In other embodiments, the stand-off elements are employed as alignment pads used for alignment with a test socket. The stand-off assemblies may each have a different external configuration (e.g. different sizes and/or shapes) to facilitate their use as alignment pads. The structure 80 can be attached to a printed circuit board by reflowing the solder bumps 50 and solder caps 78 while the stand-off elements 76 contacting the printed circuit board remain in a solid state.

Principles relating to the method described above with respect to FIGS. 3A-3D can be applied to land grid arrays. Referring to FIG. 5, an assembly 90 includes an LGA module 92, an LGA socket 94 and a printed circuit board 96. The LGA module 92 includes a plurality of package alignment assemblies 98A,B similar to the stand-off assemblies described above with respect to FIG. 4. In other words, each alignment assembly 98A,B includes an alignment element such as a metal ball having a high melting point similar to the stand-off elements 76 described above and solder encasing the stand-off element. The package alignment assemblies 98A,B are formed on the module using techniques as described with respect to FIGS. 3B-3D, after which the resist layer is stripped from the module or a wafer from which the module 92 is obtained. The socket 94 includes a plurality of alignment holes 93A,B extending therethrough. The alignment holes are located near the corners of the socket 94. The socket further includes electrical contacts 95. The printed circuit board 96 includes alignment openings 97A,B. The alignment holes in the socket and alignment openings in the printed circuit board, respectively, are aligned with each other and with the package alignment assemblies 98A,B when the module is mounted to the printed circuit board. The package alignment assemblies 98A extend through the holes 93A in the socket 94 and into the openings 97A in the printed circuit board and the alignment assemblies 98B extend through the holes 93B in the socket 94 and into the openings 97B, thereby facilitating alignment of all electrical components of the assembly 90. The alignment assembly 98A has a different external configuration than the alignment assembly 98B. The alignment hole 93A and alignment opening 97A for receiving the first alignment assembly 98A likewise have different configurations than the alignment hole 93B and alignment opening 97B for receiving the second alignment assembly. This ensures the components of the assembly 90 are properly oriented. In the illustrative embodiment shown in FIG. 5B, one of the alignment holes 93A in the socket 94 is substantially cylindrical. This first alignment hole 93A is bounded by opposing pairs of cantilevers 99 that extend towards the back side (i.e. the PCB-adjoining side) of the socket. The cantilevers 99 resiliently engage the first package alignment assembly 98A as it extends therethrough. The other package alignment assembly 98B, however, cannot fit through the alignment hole 93A within the opposite corner of the socket 94. The alignment hole 93B in the socket 94 includes a pair of opposing straight sides and a pair of opposing curved sides. Opposing cantilevers for engaging the second package alignment assembly 93B form the straight sides of the second alignment hole 93B. The package alignment assemblies 98A, 98B have external dimensions and configurations that correspond to the dimensions and configurations of the alignment holes 93A, 93B in the socket 94 as well as the alignment openings 97A, 97B in the printed circuit board 96. The components of the assembly 90 can accordingly be positioned without misalignment. The outer configurations of the package alignment assemblies can be obtained by patterning a resist layer on the LGA module 92 to include openings having similar configurations to the alignment holes 93A, 93B. The solder deposited into the resist openings encases the alignment elements and forms external surfaces suitable for insertion within the respective alignment holes 93A, 93B. The LGA module 92 comprises a single chip in some embodiments and a plurality of chips in other embodiments. The alignment openings 97A, 97B may or may not extend entirely through the printed circuit board. The alignment elements comprising the alignment assemblies 98A, 98B are sufficient in size to extend through the socket alignment holes 93A, 93B in one or more embodiments.

The methods described above can be used in the packaging of integrated circuit chips, particularly flip chips; in particular, techniques set forth herein can be used to for attachment of an assembly including a chip to a printed circuit board. Integrated circuit chips can be distributed by a fabricator in raw wafer form (that is, as a single wafer that has multiple unpackaged chips), as a bare die or in a packaged form. In the latter case, the chip can be mounted in a single chip package (such as a plastic carrier, with leads that are affixed to a mother board or other higher level carrier) or in a multi-chip package (such as a ceramic carrier that has either or both surface interconnections or buried interconnections). In any case, the chip may then be integrated with other chips, discrete circuit elements and/or other signal processing devices as part of either (a) an intermediate product, such as a mother board, or (b) an end product. The end product can be any product that includes integrated circuit chips, ranging from toys and other low-end or consumer electronic applications to advanced computer products, having a display, a keyboard or other input device, and a central processor.

Aspects of the methods disclosed herein are described with reference to flow diagram illustrations according to embodiments of the invention. It will be understood that each segment of the flow diagram illustrations representing one or more steps, and combinations of segments in the flow diagram illustrations, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flow diagrams.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flow diagrams or segments thereof.

It should be noted that any of the methods described herein can include an additional step of providing a system comprising distinct software modules embodied on a computer readable storage medium; the modules can include, for example, an initialization module, a module to cycle through test points and parameters, an output module to generate an output file, a post-processing module to reduce the data and search for anomalies, and the like. The method steps, such as those described with respect to FIG. 1 can then be carried out using the distinct software modules and/or sub-modules of the system, as described above, executing on one or more hardware processors. Further, a computer program product can include a computer-readable storage medium with code adapted to be implemented to carry out one or more method steps described herein, including the provision of the system with the distinct software modules.

Given the discussion thus far and with reference to the exemplary embodiments discussed above and the drawings, an exemplary method includes obtaining a panel 40 having a front side, a back side, and a plurality of electrically conductive contact pads 42. A resist film 46 is applied to the back side of the panel and patterned to form channels 48 exposing a plurality of the contact pads 42. Solder material is introduced within the channels. The method further includes a singulation step, wherein one or more panel portions 54 and associated resist layer and solder bumps 50 are separated from the panel subsequent to introducing the solder material within the channels 48. A chip 58 is electrically and mechanically connected to the front side of the panel or panel portion subsequent to introducing the solder material within the channels, such as shown in FIG. 2F and while the resist film remains on the panel or panel portion. The resist film 46 is stripped from the panel subsequent to the steps of separating the one or more panel portions from the panel and connecting the chip electrically and mechanically to the front side of the panel or panel portion. The resulting structure 60, such as shown in FIG. 2G, is connected electrically and mechanically to a circuit card 62 by reflowing the solder material, and then cooling the solder material. The resist film is stripped prior to card assembly in one or more embodiments. The fabrication method is applicable to cored and coreless laminate panels. In some embodiments, the step of introducing the solder material within the channels includes injecting molten solder into the channels. Underfill material 59 may be applied between the chip 58 and the laminate panel 40. A laminate panel includes a solder mask 44 in some embodiments. In some embodiments, different solder materials having different melting points are introduced into the channels 48. The solder material having the lower melting point is reflowed during the step of connecting the panel and chip to the circuit card while the solder material having the higher melting point remains solid, thereby functioning as a stand-off. Underfill or other electrically non-conductive material may then be introduced into a space between the circuit card and the panel. Stand-off elements comprising materials other than solder, such as balls made from certain metals and/or polymers that do not melt at temperatures associated with solder reflow, are employed in some embodiments.

A further method includes obtaining a structure including a panel including a front side, a back side, and a plurality of electrically conductive contact pads 42, a patterned resist layer 46 directly contacting the back side of the panel, the patterned resist layer including a plurality of channels 48 exposing the plurality of contact pads, and a plurality of solder bumps 50, each of the solder bumps being within one of the channels and electrically contacting one of the contact pads 42. Singulation of the panel creates panel portions, each having an array of solder bumps within the resist layer. The method further includes the steps of connecting a chip 58 electrically and mechanically to the front side of the panel of the structure or panel portion, the chip comprising one or more electronic devices. The patterned resist layer is stripped from the back side of the panel portion. The panel portion is connected electrically and mechanically to a circuit card 62 subsequent to stripping the patterned resist layer from the back side of the panel portion. Such connection is achieved at least in part by reflowing the array of solder bumps. A structure 65 such as shown schematically in FIG. 2H can accordingly be obtained. In some embodiments, selected channels within the resist layer contain stand-off elements as described above. The method is applicable to various panel types, including laminate panels (cored and coreless) and glass panels.

An exemplary structure in accordance with the present disclosure includes a substrate 45 including a front side, a back side, and electrically conductive contact pads on the back side. A resist film 46 directly contacts the back side of the substrate. The resist film includes channels 48 exposing a plurality of the contact pads. The structure further includes a plurality of solder bumps 50, each of the solder bumps being within one of the channels in the resist film and electrically contacting one of the contact pads. A plurality of contact elements (43 or 52) are on the front side of the substrate and are configured for electrical connection to a chip. In some embodiments, the contact elements on the front side of the laminate panel include solder bumps.

An electronic assembly, such as the exemplary assembly 80 shown in FIG. 4, is provided in accordance with further embodiments. Such an assembly includes a substrate including a front side, a back side, and an array of electrically conductive contact pads. A plurality of solder bumps 50 is attached to the back side of the substrate, each of the solder bumps contacting one of the contact pads. A chip is electrically and mechanically connected to the front side of the substrate. One or more stand-off assemblies are attached to the back side of the substrate, each of the one or more stand-off assemblies including a stand-off element 76 and solder material (solder cap 78) encasing the stand-off element, each stand-off element having a higher melting point than the solder bumps and the solder material. In some embodiments, the solder cap 78 and solder bumps 50 comprise the same material and can be reflown at the same temperature. In some embodiments, each stand-off element is a ball-shaped element. In one or more embodiments, the solder bumps and stand-off assemblies are of equal height. In some embodiments, the solder elements comprise metal solder balls made from metals such as nickel or copper. In one or more embodiments, the substrate is rectangular and the stand-off assemblies 76 adjoin the corners of the substrate, such as shown in FIG. 4.

A further exemplary method includes obtaining a land grid assembly module 92, forming a patterned resist layer on the land grid assembly module, the patterned resist layer including first and second channels, inserting an alignment element having a first melting point within each of the first and second channels in the resist layer, and injecting molten solder material having a second melting point lower than the first melting point into the first and second channels. The solder material in the first and second channels cools, thereby forming first and second alignment assemblies 98A, 98B attached to the land grid assembly module 92, Each of the first and second alignment assemblies comprising one of the alignment elements is encased by solder material. The patterned resist layer is removed from the land grid assembly module following formation of the first and second alignment assemblies. In one or more embodiments, further steps include obtaining a socket 94 having first and second alignment holes 93A, 93B, obtaining a printed circuit board having first and second alignment openings 97A, 97B, and inserting the first and second alignment assemblies, respectively, through the first and second alignment holes in the socket 94 and into the first and second alignment openings in the printed circuit board.

A further exemplary electronic assembly 90 includes a land grid assembly module 92, a printed circuit board including a plurality of first alignment holes 97A, 97B, and a land grid assembly socket 94 positioned between and electrically connected to the land grid assembly module 92 and the printed circuit board. The socket 94 includes a plurality of second alignment holes 93A, 93B extending therethrough. First and second alignment assemblies 98A, 98B are attached to and extend from the LGA module 92. Each alignment assembly includes an alignment element having a first melting point extending from the module and solder material encasing the alignment element, the solder material having a second melting point lower than the first melting point. The first and second alignment assemblies 98A, 98B extend through the second alignment holes in the socket 94 and into the first alignment holes in the printed circuit board. The alignment elements comprise ball-shaped elements similar to the element 76 shown in FIG. 3D. The alignment assemblies 98A, 98B have different external configurations in some embodiments, such as different sizes and/or shapes as shown in FIG. 5B, to ensure proper orientation of the module 92 with respect to the other components of the assembly.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Terms such as "above", "below", "top" and "bottom", "front and back" are generally employed to indicate relative positions as opposed to relative elevations unless otherwise indicated. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. As discussed above, however, application of the temporary resist prior to certain steps such as singulation, chip joining and underfill application is advantageous. The resist can act as a cushion that protects solder bumps 50 during subsequent bonding and assembly (BA) processes and may reduce laminate panel warpage during subsequent processing in some embodiments.

It will be appreciated and should be understood that the exemplary embodiments of the invention described above can be implemented in a number of different fashions. The embodiments were chosen and described in order to best explain the principles of the invention and the practical application, and to enable others of ordinary skill in the art to understand the invention for various embodiments with various modifications as are suited to the particular use contemplated. Given the teachings of the invention provided herein, one of ordinary skill in the related art will be able to contemplate other implementations of the invention.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method comprising:
   obtaining a structure including:
      a panel including a front side, a back side, and a plurality of electrically conductive contact pads,
      a patterned resist layer directly contacting the back side of the panel, the patterned resist layer including a plurality of channels, and
      a plurality of solder bumps, each of the solder bumps being within one of the channels and electrically contacting one of the contact pads;
   singulating the panel to obtain a plurality of panel portions, each panel portion having front and back sides, portions of the resist layer, and an array of the solder bumps;
   connecting a chip electrically and mechanically to the front side of the panel of the structure or to the front side of one of the panel portions, connection of the chip being effected while the resist layer is on the back side of the panel or while a portion of the resist layer is on the back side of the one of the panel portions, the chip comprising one or more electronic devices;
   stripping the patterned resist layer from the back side of the one of the panel portions subsequent to the step of connecting the chip electrically and mechanically to the front side of the panel of the structure or to the front side of the one of the panel portions, and
   connecting the one of the panel portions electrically and mechanically to a circuit card, the step of connecting the one of the panel portions including the step of reflowing the solder bumps.

2. The method of claim 1, further including the step of pre-solder bumping the front side of the panel prior to connecting the chip electrically and mechanically to the front side of the panel of the structure or to the front side of the one of the panel portions.

3. The method of claim 1, wherein the step of singulating the panel is performed prior to connecting the chip to the front side of the one of the panel portions.

4. The method of claim 1, wherein the panel is a coreless laminate panel or glass panel and the step of connecting the one of the panel portions electrically and mechanically to a circuit card is performed subsequent to stripping the patterned resist layer.

5. The method of claim 1, wherein the panel is a laminate panel including a solder mask, the solder mask comprising a part of the back side of the laminate panel.

6. The method of claim 1, wherein the solder bumps include a first plurality of solder bumps having a first melting point and a second plurality of solder bumps having a second melting point higher than the first melting point, and further wherein the step of connecting the one of the panel portions electrically and mechanically to the circuit card further includes causing reflow of the first solder bumps while the second solder bumps remain in a solid state.

7. The method of claim 1, wherein the structure further includes one or more stand-off elements within one or more of the channels of the patterned resist layer and solder material encasing the one or more stand-off elements, the one or more stand-off elements having substantially higher melting points than the solder material and the solder bumps.

8. The method of claim 1, wherein the step of obtaining the structure includes:
obtaining the panel;
applying the resist layer to the back side of the panel;
patterning the resist layer to form channels exposing a plurality of the contact pads, and
introducing solder material within the channels and contacting the contact pads.

9. The method of claim 8, wherein the step of obtaining the structure further includes:
depositing stand-off elements within a plurality of the channels of the patterned resist film, the stand-off elements having substantially higher melting points than the solder bumps, and
introducing solder material within the one or more channels containing the stand-off elements.

10. The method of claim 9, wherein the stand-off elements include ball-shaped elements.

11. The method of claim 9, wherein the step of connecting the one of the panel portions electrically and mechanically to the circuit card further includes reflowing the solder bumps while the stand-off elements remain in a solid state.

12. The method of claim 9, wherein the step of singulating the panel further includes causing a plurality of the panel portions to each include at least one stand-off element.

13. The method of claim 9, wherein the step of introducing the solder material within the channels includes injecting molten solder or solder paste into the channels.

14. A method comprising:
obtaining a land grid assembly module;
forming a patterned resist layer on the land grid assembly module, the patterned resist layer including first and second channels;
inserting an alignment element having a first melting point within each of the first and second channels in the resist layer;
injecting molten solder material having a second melting point lower than the first melting point into the first and second channels;
cooling the solder material within the first and second channels, thereby forming first and second alignment assemblies attached to the land grid assembly module, each of the first and second alignment assemblies comprising one of the alignment elements encased by the solder material, and
removing the patterned resist layer from the land grid assembly module.

15. The method of claim 14, wherein the land grid assembly module has a rectangular configuration, each alignment element is ball-shaped, the first channel adjoining a first corner portion of the land grid assembly module and the second channel adjoining a second corner portion of the land grid assembly module.

16. The method of claim 14, wherein the first alignment assembly has a different external configuration than the second alignment assembly, further including the steps of:
obtaining a socket having first and second alignment holes;
obtaining a printed circuit board having first and second alignment openings;
inserting the first and second alignment assemblies, respectively, through the first and second alignment holes in the socket and into the first and second alignment openings in the printed circuit board.

* * * * *